United States Patent [19]
Ochi

[11] Patent Number: 5,477,479
[45] Date of Patent: Dec. 19, 1995

[54] MULTIPLYING SYSTEM HAVING MULTI-STAGES FOR PROCESSING A DIGITAL SIGNAL BASED ON THE BOOTH'S ALGORITHM

[75] Inventor: Masahide Ochi, Tokyo, Japan

[73] Assignee: NKK Corporation, Tokyo, Japan

[21] Appl. No.: 184,822

[22] Filed: Jan. 19, 1994

[30] Foreign Application Priority Data

Mar. 8, 1993 [JP] Japan .................................. 5-046969
Jun. 21, 1993 [JP] Japan .................................. 5-149272

[51] Int. Cl.$^6$ ................................................ G06F 7/52
[52] U.S. Cl. ...................................... 364/760; 364/724.16
[58] Field of Search ............................... 364/760, 724.16

[56] References Cited

U.S. PATENT DOCUMENTS

| | | | |
|---|---|---|---|
| 4,180,814 | 12/1979 | Barton | 343/5 DP |
| 4,635,276 | 1/1987 | Karabinis | 375/15 |
| 4,800,517 | 1/1989 | Asghar et al. | 364/757 |
| 4,931,973 | 6/1990 | Asghar et al. | 364/724.16 |
| 4,967,388 | 10/1990 | Tate | 364/760 |
| 5,231,415 | 7/1993 | Hagihara | 364/760 |
| 5,303,178 | 4/1994 | Ozaki | 364/760 |
| 5,325,321 | 6/1994 | Ishida | 364/760 |
| 5,333,119 | 7/1994 | Raatz et al. | 364/760 |

FOREIGN PATENT DOCUMENTS

| | | |
|---|---|---|
| 57-28129 | 6/1982 | Japan . |
| 57-141753 | 9/1982 | Japan . |
| 61-246837 | 11/1986 | Japan . |
| 62-22146 | 1/1987 | Japan . |
| 62-29334 | 2/1987 | Japan . |
| 62-17770 | 4/1987 | Japan . |
| 62-216035 | 9/1987 | Japan . |
| 63-83834 | 4/1988 | Japan . |
| 63-78230 | 4/1988 | Japan . |
| 63-78229 | 4/1988 | Japan . |
| 63-286933 | 11/1988 | Japan . |
| 2-30531 | 7/1990 | Japan . |
| 4-37211 | 2/1992 | Japan . |
| 4-67227 | 3/1992 | Japan . |
| 4-186428 | 7/1992 | Japan . |

*Primary Examiner*—David H. Malzahn
*Attorney, Agent, or Firm*—Michael N. Meller

[57] ABSTRACT

A method of processing a digital signal and an apparatus therefor, in which operation can be performed at a higher speed, and there is no futility in the system configuration. The apparatus has a plurality of multipliers and a Booth algorithm is used in each of the multipliers to shorten the time taken for addition of partial products in the process of multiplication. In view of the fact that the algorithm is executed in an overlapping manner in the multiplication processes in the respective multipliers, the execution of this algorithm is made to be common to the respective multiplication processes. To execute the algorithm in common, blocks in the respective multipliers for executing the algorithm are separated from the multipliers so as to be a common Booth decoder. For example, the digital signal processing apparatus includes a multiplication unit and a Booth decoder. The multiplication unit includes a multiplier having no block for executing a Booth algorithm and executes the same or the same kind of multiplications. The Booth decoder makes a Booth algorithm in common to the multiplier and supplies decoder signals. The apparatus of the present invention is suitable for a transposable digital filter apparatus in particular.

4 Claims, 9 Drawing Sheets

PRIOR ART

8: HALF ADDER

FIG. 10

9: WHOLE ADDER

MULTIPLYING SYSTEM HAVING MULTI-STAGES FOR PROCESSING A DIGITAL SIGNAL BASED ON THE BOOTH'S ALGORITHM

BACKGROUND OF THE INVENTION

The present invention relates to a method of processing a digital signal and an apparatus therefor, and particularly to an improvement of a multiplying system in operational processing including a plurality of integrated multipliers, for example, in digital signal processing by means of digital filters, digital signal processors, etc.

Use of Booth's algorithm is well known for making the speed of the partial product adding process high in conventional multipliers (for example, reference is made to "Digital Signal Processing Handbook", edited by the Institute of Electronics, Information and Communication Engineers of Japan, Chapter 3; Japanese Patent Post-Examination No. Sho-57-28129; Japanese Patent Unexamined Publication No. Hei-4-67227; Japanese Patent Post-Examination No. Hei-2-30531; Japanese Patent Post-Examination No. Sho-62-17770; and so on). This algorithm will be described briefly by way of example in which partial products are generated by the secondary Booth's algorithm. In the form of expression with complement of "2", a multiplier Y is expressed by the following expression 1:

$$Y = -y_n \times 2^{n-1} + \sum_{i=1}^{n-1} y_i \times 2^{i-1} \quad (1)$$

in which $y_n$ is a code bit, and $y_{n-1}$ to $y_1$ are numeric portions. Assuming the length n of Y is an even number and $y_0=0$ for the sake of simplification, the above expression can be made into the following expression 2.

$$Y = \sum_{i=0}^{n/2-1} (y_{2i} + y_{2i+1} - 2y_{2i+2}) \times 2^{2i} \quad (2)$$

Assuming a multiplicand is X, the multiplication $P=X \cdot Y$ is expressed by the following expression 3:

$$P = \sum_{i=0}^{n/2-1} (y_{2i} + y_{2i+1} - 2y_{2i+2}) X \times 2^{2i} \quad (3)$$

Therefore, the product P can be obtained by summing n/2 partial products $(y_{2i}+y_{2i+1}-2y_{2i+2})X \cdot 2^{2i}$. Here, $2^{2i}$ corresponds to the weight of a bit. Since $(y_{2i}+y_{2i+1}-2y_{2i+2})$ takes any of 0, ±1, and ±2 in accordance with the values of the three bits $y_{2i}$, $y_{2i+1}$ and $y_{2i+2}$, each partial product takes any of 0, ±X, and ±2X. In this case, 2X is the double of the multiplicand, and therefore it can be produced by shifting the multiplicand by one bit. The negative values can be produced by such a manner, for example, in which the complement of X (X (this X is expressed sometime as /X(X bar), but it is expressed in the present specification merely as X) is produced temporarily, and "1" (one) is added to its LSB (least significant bit). According to such Booth's algorithm, partial products can be obtained in the form including a code bit without specially dealing with a code bit in the expression with complement of "2", so that a correction circuit is not necessary, and there is a large advantage in construction of a hardware. In this algorithm, the input signals $y_{2i}$, $y_{2i+1}$ and $y_{2i+2}$ are virtually decoded so as to be converted into an output signal B which is 0, ±1 or ±2. A signal processing block on a hardware performing this processing is a Booth decoder.

Figure 3:
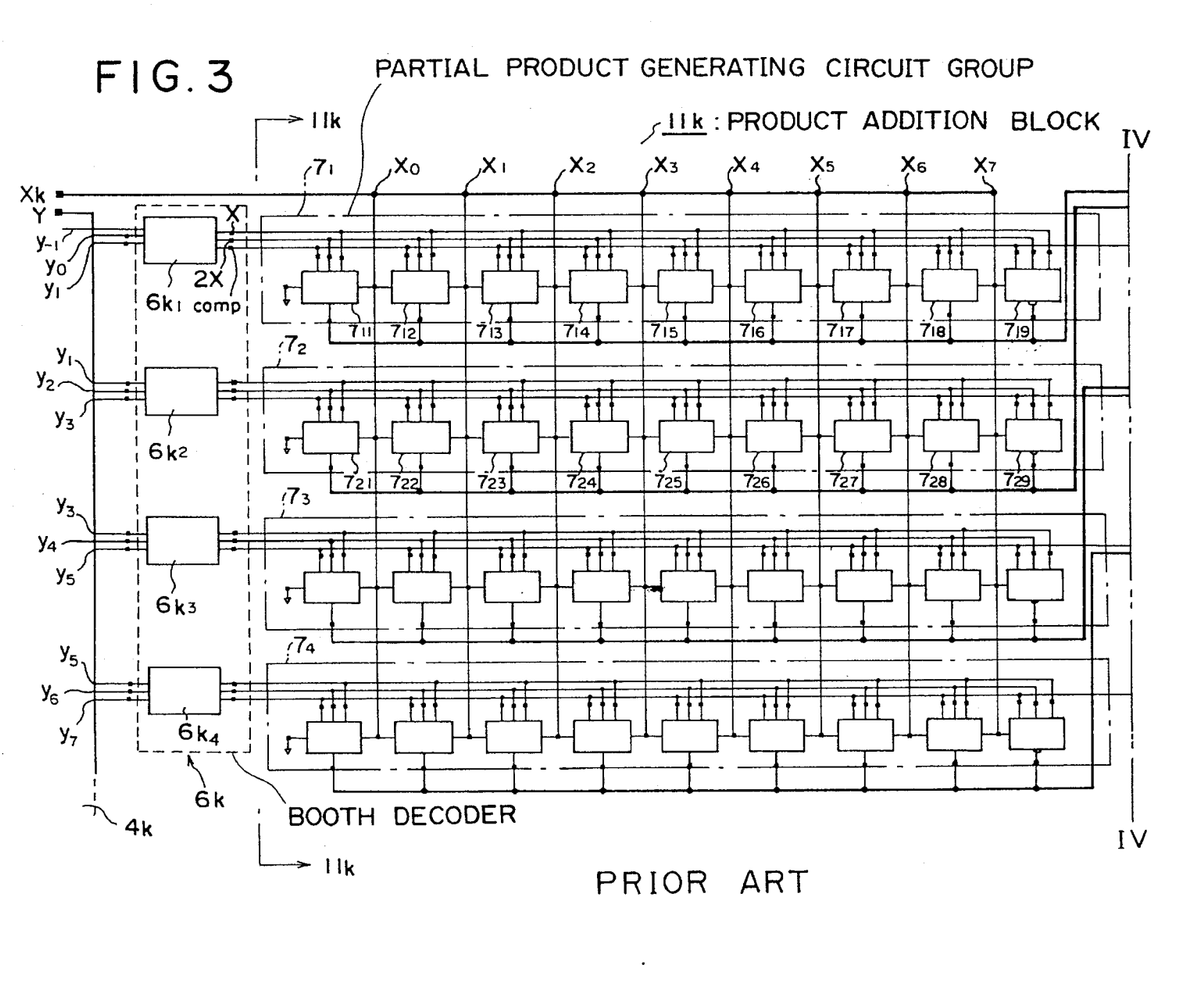
FIG. 3 is a circuit diagram illustrating a first example of the configuration of parallel multipliers for executing the Booth's algorithm.
Figure 4:
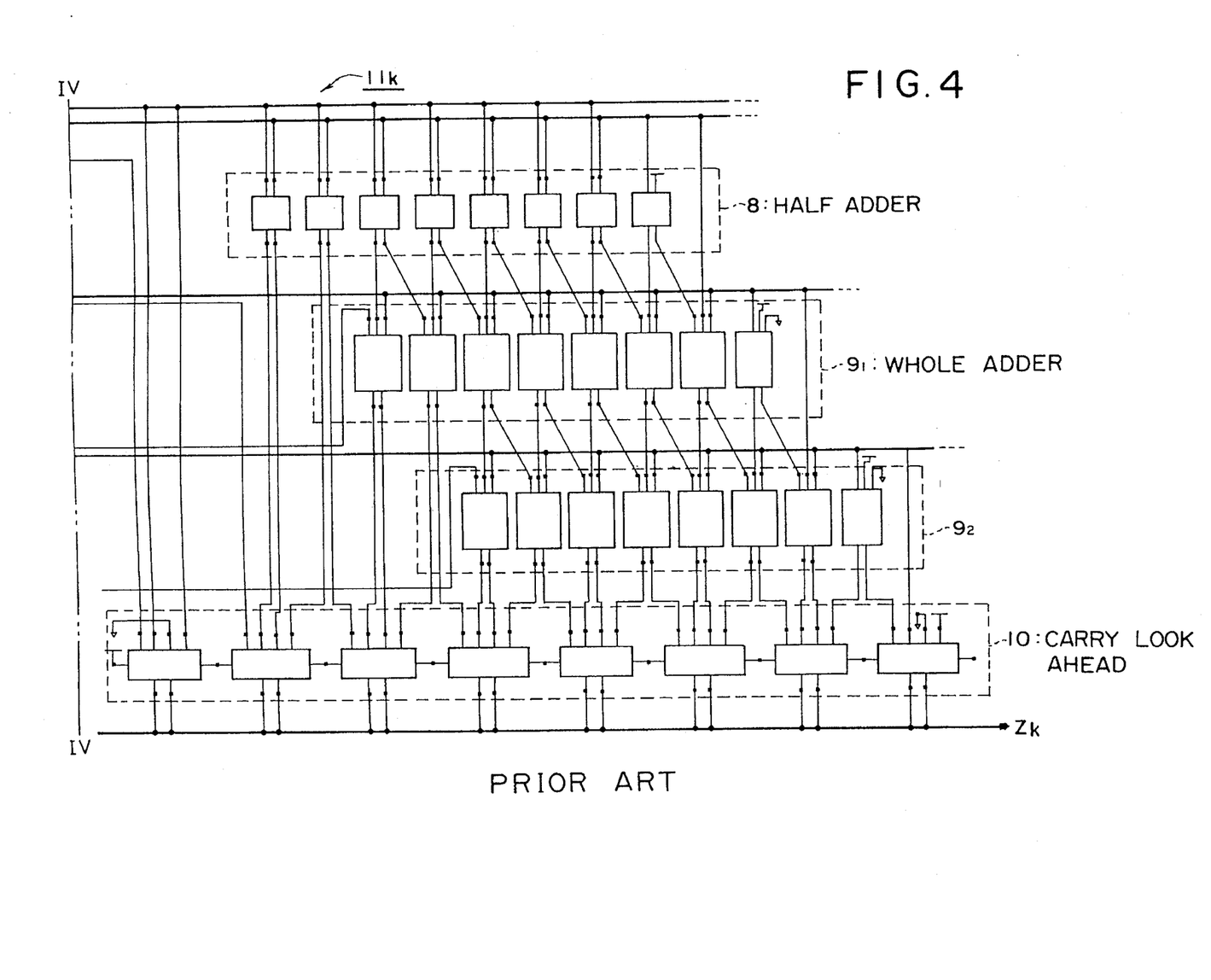
FIG. 4 is a circuit diagram illustrating a second example of the configuration of parallel multipliers for executing the Booth's algorithm.

FIGS. 3 and 4 are circuit diagrams illustrating an example of the configuration of parallel multipliers for executing such Booth's algorithm. These circuit diagrams show an example of processing a multiplier Y $(=y_0y_1y_2y_3y_4y_5y_6y_7)$ and a multiplicand $X_k$ $(=x_0x_1x_2x_3x_4x_5x_6x_7)$ each of which has eight figures. The reference numeral $6_k$ (k=1, 2, ..., n) represents a block for executing Booth's algorithm, that is, a Booth decoder, which is constituted by elemental decoders $6_{kh}$ (h=1, 2, 3, 4). The respective elemental decoders are also Booth decoders, but they are expressed by elemental decoders for the sake of convenience in order to avoid the complication of the term. Each elemental decoder $6_{kh}$ has a function to decide which one of the values 0, ±1 and ±2 should be a coefficient for generating a partial product by $y_{p-1}$, $y_p$ and $y_{p+1}$ (P=0, 1, 2, ... 6; y-1=0) corresponding to $y_{2i}$, $y_{2i+1}$ and $y_{2i+2}$, and outputs a signal B (=(x, 2x, comp)).

Figure 5:
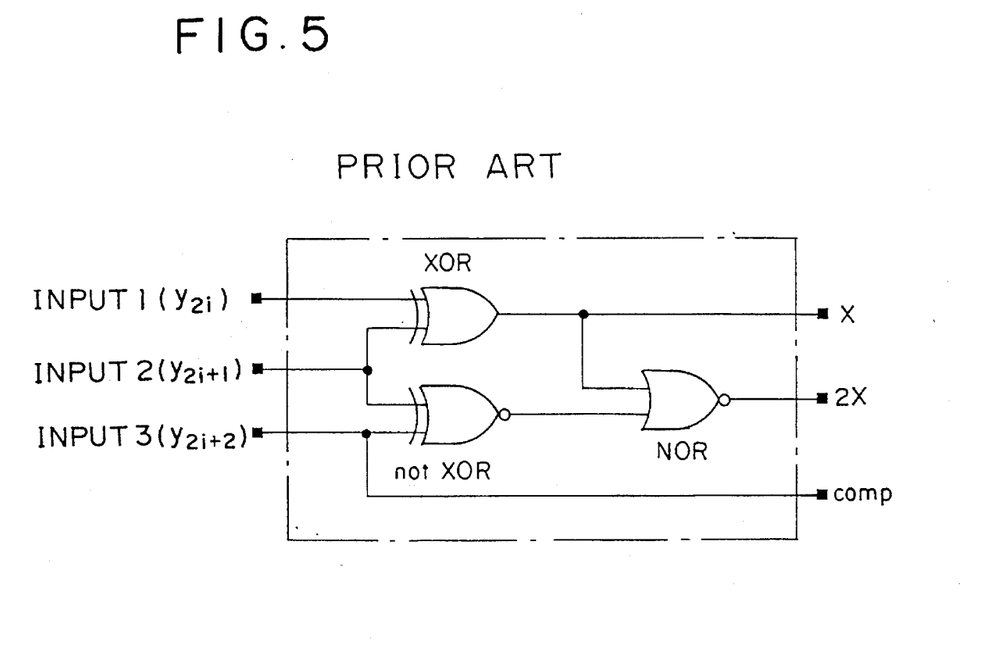
FIG. 5 is a circuit diagram of a typical example of the Booth decoder.

FIG. 5 is a circuit diagram of a typical example of a Booth decoder. Although there are various Booth decoders including that which is disclosed in Japanese Patent Unexamined Publication No. Sho-62-29334, the Booth decoder of FIG. 5 will be described herein by way of example. In FIG. 5, $y_{2i}$, $y_{2i+1}$ and $y_{2i+2}$ are inputted correspondingly to inputs 1, 2 and 3, and a signal B is outputted in accordance with the combination of the input values. Table 1 shows this relationship between the input and output the form of a truth table.

TABLE 1

| TRUTH TABLE | | | | | |
|---|---|---|---|---|---|
| Input 3 | Input 2 | Input 1 | X | 2X | comp |
| 0 | 0 | 0 | 0 | 0 | 0 |
| 0 | 0 | 1 | 1 | 0 | 0 |
| 0 | 1 | 0 | 1 | 0 | 0 |
| 0 | 1 | 1 | 0 | 1 | 0 |
| 1 | 0 | 0 | 0 | 1 | 1 |
| 1 | 0 | 1 | 1 | 0 | 1 |
| 1 | 1 | 0 | 1 | 0 | 1 |
| 1 | 1 | 1 | 0 | 0 | 1 |

Figure 8:
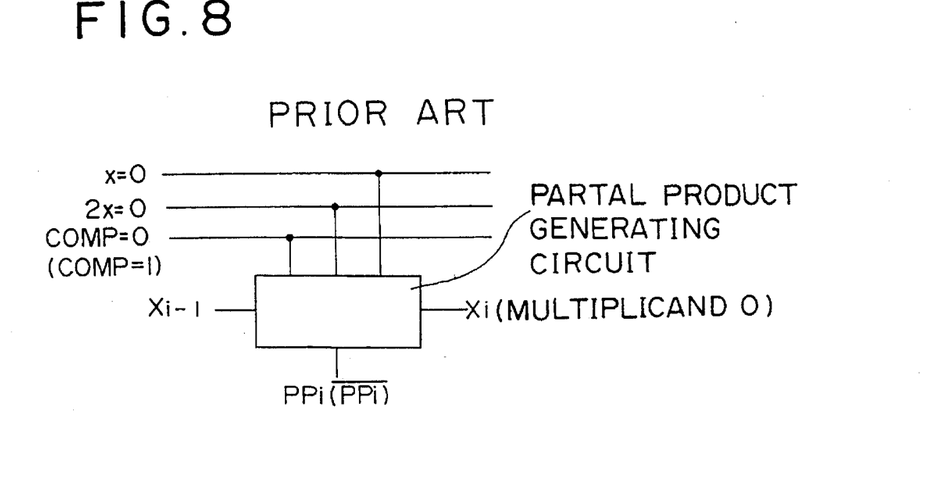
FIG. 8 is a diagram for explaining the operation of the partial product generating circuit.
Figure 9:
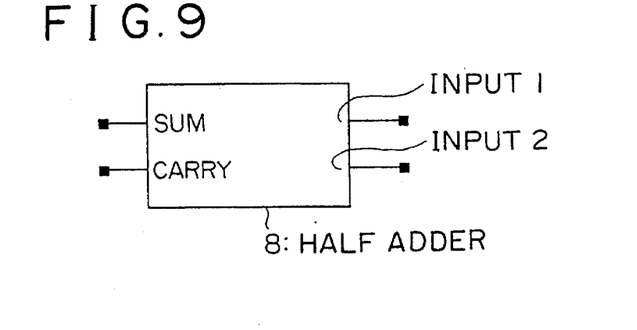
FIG. 9 is a diagram for explaining input/output terminals of a half adder.
Figure 10:
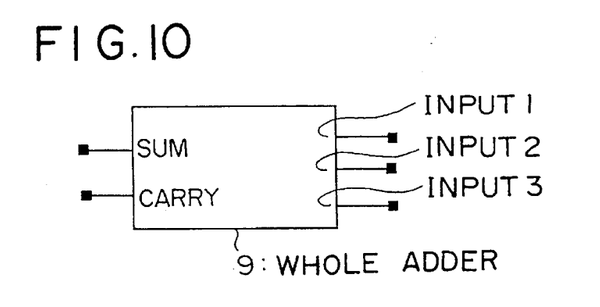
FIG. 10 is a diagram for explaining input/output terminals of a whole adder.
Figure 11:
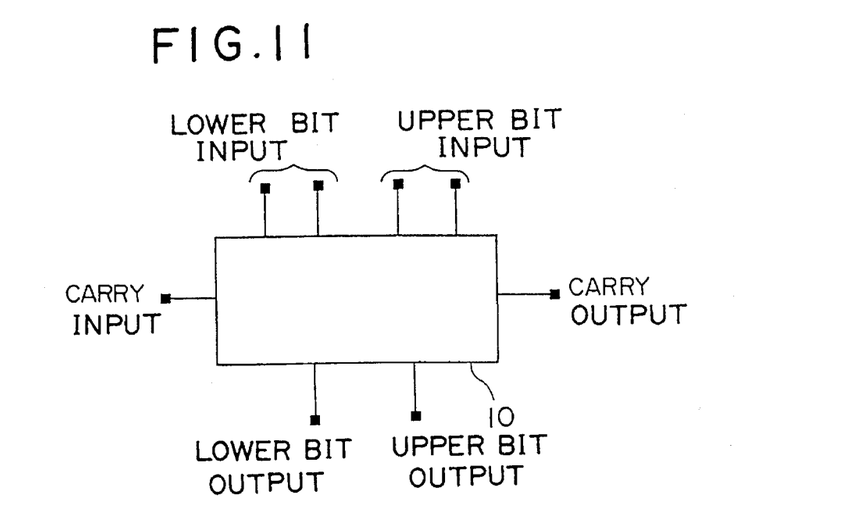
FIG. 11 is a diagram for explaining the input/output terminals of the carry look ahead.

Now return to FIGS. 3 and 4 again. Each of the partial product generating circuit group $7_h$ (h=1, 2, 3, 4) generates a partial product of X and Y in accordance with the signal B. Each partial product generating circuit group $7_h$ includes nine partial product generating circuits $7_{hg}$ (g=1, 2, ..., 9). In FIG. 3, however, those in only the case of g=1 or 2 are numbered in order to facilitate understanding of the drawing. The operation of a partial product generating circuit $7_{hj}$ will be described with reference to FIGS. 6 to 8. If the signal B is (x, 2x, comp)=(1, 0, 0), the value of an element $x_i$ of a multiplicand $X_k$ is supplied to the partial product generating circuit $7_{hj}$. If the signal B is (x, 2x, comp)=(0, 1, 0), an element $x_{i-1}$ is supplied to the partial product generating circuit $7_{hj}$. In the case of 2X=1 in the partial product generating circuit $7_{h1}$, a grounded portion becomes the input of lower bits. In the case of comp=1, "1" is added to the LSB of the partial product to form a complement of X or 2X. Output signals of the partial product generating circuits $7_1$ and $7_2$ are added by a half adder 8 which is connected those partial product generating circuits $7_1$ and $7_2$ through bus wiring. An output signal of the partial product generating circuit $7_3$ is added to a branch output signal of the half adder 8 by a hole adder $9_1$ which is connected to the partial product generating circuit $7_3$ and the half adder 8 through bus wiring. An output signal of the partial product generating circuit $7_4$ is added to a branch output signal of the half adder $9_1$ by a whole adder $9_2$ which is connected to the partial product generating circuit $7_4$ and the half adder $9_1$ through bus wiring. Finally a branch output signal of the partial product generating circuit $7_1$, branch output signals of the half adder 8 and the hole adder $9_1$, and an output signal of the hole adder $9_2$ are added to each other by a carry look ahead (CLA) 10, and an output of the carry look ahead (CLA) 10 is outputted as a multiplication signal $Z_k$. The respective input and output terminals of the half adder 8, the whole adders $9_1$ and $9_2$, and the carry look ahead 10 are arranged as illustrated in FIGS. 9 to 11.

Thus an ordinary multiplier is constituted by a Booth decoder block and the other block 11 (hereinafter called "product addition block") including the block of a partial product generating circuit. Specifically, various configurations thereof are disclosed in Japanese Patent Unexamined Publication No. Sho-57-141753, No. Sho-61-246837, No. Sho-62-22146, No. Sho-62-216035, No. Sho-63-78229, No. Sho-63-78230, No. Sho-63-83834, No. Sho-63-286933, No. Hei-4-37211, No. Hei-4-186428, and so on.

On the other hand, a multiplier is indispensable in a digital signal processing technique such as a digital filter, a digital signal processor, or the like, and a plurality of multipliers are often included in one apparatus.

Figure 12:
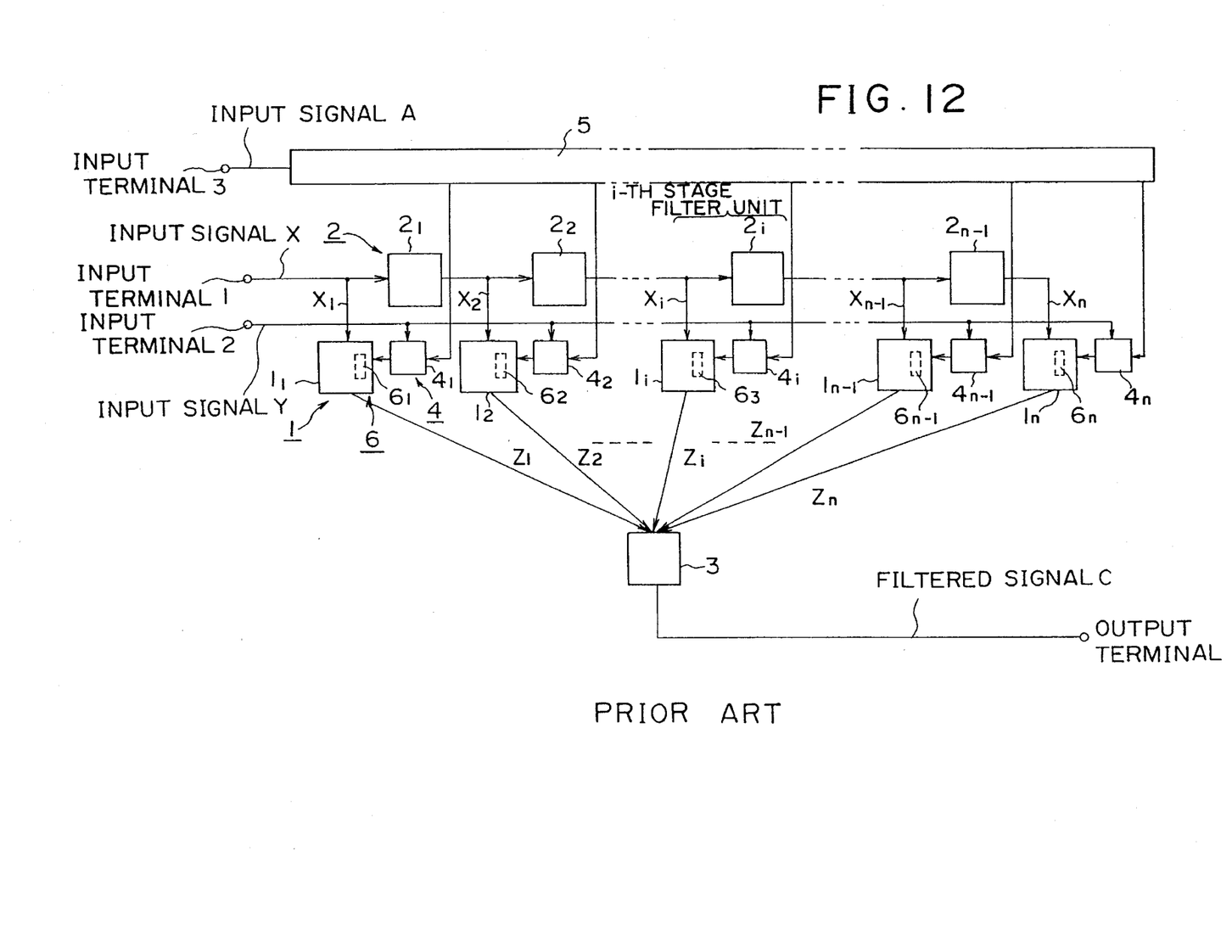
FIG. 12 is a block diagram illustrating the circuit configuration of the digital filter called a direct type.

FIG. 12 is a block diagram illustrating a circuit configuration of a conventional digital filter called a direct type. In this filter, an input signal X is supplied from an input terminal 1, and on the way of the input signal X to pass through a plurality of delay elements 2, the output signals $X_k$ of the respective delay elements $2_{k-1}$ (k=1, 2, ..., i, ..., n; $2_0$ means no delay) and a discrete variable Y are processed along the Booth's algorithm in each multiplier $1_k$. In this case, the signal Y is decoded by a Booth decoder $6_k$ in the multiplier $1_k$, and a multiplication value $Z_k$ is generated by signal processing based on the decoded signal and the signal X. The values $Z_k$ are added totally in an adder 3. The adder 3 outputs a filtered signal C to its output terminal. The signal Y is supplied from a terminal 2 so as to be temporarily accumulated in each of storage elements 4 such as registers. The operation timing of each storage element $4_k$ is controlled by an address decoder 5.

In the case of a digital filter of this type, we call the unit consisting of delay element $2_i$, the multiplier $1_i$ having the Booth decoder $6_i$ and the memory element $4_i$ "i-th stage filter unit (i=1, 2, ... n) for conveniences sake. Then, it can be thought that the apparatus indicated in FIG. 12 is an apparatus in which n pieces of filter units are connected in series and the output signals $Z_j$ (j=1, 2, ... n) from each stage can be added by a single adder 3.

Figure 13:
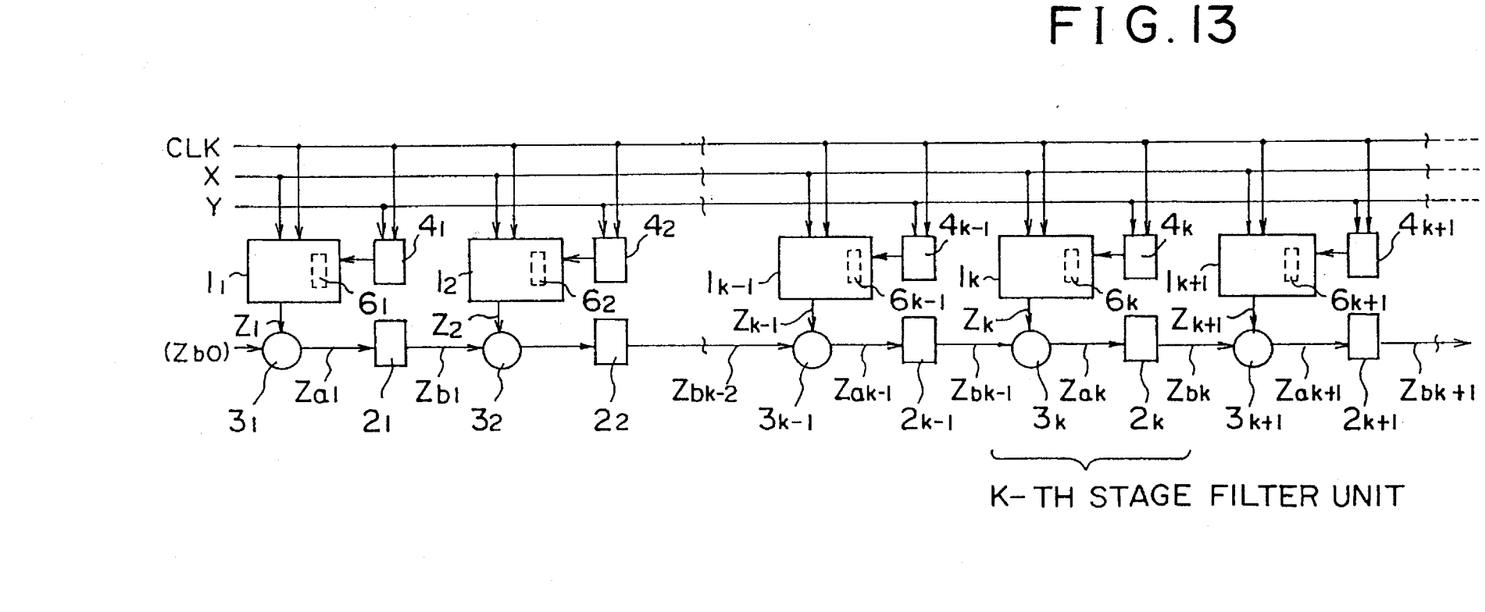
FIG. 13 is a block diagram illustrating the circuit configuration of the digital filter called a transposition type.

FIG. 13 is a block diagram illustrating the circuit configuration of a conventional digital filter called transposition type. A unit constituted by a storage element $4_k$, a multiplier $1_k$, an adder $3_k$ and a delay element $2_k$ is named "k-th stage filter unit" for the sake of convenience in description. First in the k-th stage filter unit(k=1, 2, ... i,..n), a signal X is supplied to the multiplier $1_k$ while another input signal Y is supplied to the multiplier $1_k$ through the storage element $4_k$. The two signals are processed along the Booth's algorithm in the multiplier $1_k$. In this case, the signal Y is decoded by the Booth decoder $6_k$ in the multiplier $1_k$, and a multiplication value $Z_k$ is generated by signal processing based on the decoded signal and the signal X. The multiplication value $Z_k$ is supplied to the adder $3_k$ from the multiplier $1_k$ and added to a signal $Z_{bk-1}$ from the (k−1)-th stage filter unit, and the result of addition is supplied to the delay element $2_k$ as a signal $Z_{ak}$.

As a result, the signal $Z_{ak}$ becomes a delayed signal $Z_{bk}$. In the same manner, in the following stage, the (k+1)-th stage filter unit, the signal X is supplied to the multiplier $1_{k+1}$ while another signal Y is supplied to the multiplier $1_{k+1}$ through the storage element $4_{k+1}$. The two signals are processed along the Booth's algorithm in the multiplier $1_k$ in the same manner as in the case of the k-th stage filter unit so that a multiplication value $Z_{k+1}$ is generated. The multiplication value $Z_{k+1}$ is supplied to the adder $3_{k+1}$ from the multiplier $1_{k+1}$ and added to the signal $Z_{bk}$ from the k-th stage filter unit, the result of addition being supplied, as a signal $Z_{ak+1}$, to the delay element $2_{k+1}$. As a result, the signal $Z_{ak+1}$ becomes a delayed signal $Z_{bk+1}$. The same operation is repeated in each filter unit, and finally a filtered signal C is outputted.

The respective operation timings of the delay element 2 and the storage element 4 in each filter unit are controlled by a clock signal CLK. The operation timing in each filter unit and the operation timing between filter units can be attained under the above-mentioned control by the clock signal CLK and in a cycle taking into consideration the signal delay produced in each filter unit. A signal $Z_{b0}$ other than a signal $Z_1$ is supplied to an adder $3_1$, while the signal $Z_{b0}$ is assumed to be a grounded signal in the above description.

The above examples are merely typical ones, but it is understood therefrom that a digital filter includes a number of multipliers. Further, being represented by these examples, it has been general that in a multiplication system a plurality of multipliers are connected in parallel to thereby increase the speed of operation.

In a conventional digital signal processing method or in a conventional digital signal processing apparatus, a Booth decoder is included in each multiplier itself. Accordingly, in the case using a plurality of multipliers to performing digital signal processing, the Booth's algorithm is executed in an overlapping manner in the respective multipliers. For example, in a conventional digital filter, individual Booth decoders $6_k$ or elemental decoders $6_{kh}$ are operated in an overlapping manner respectively in a plurality of multipliers connected in parallel to each other. This is vain in the quantity of operation of the system as a whole. Further, each multiplier includes a Booth decoder having the same function, so that the hardware is made complicated in Structure in vain. Further, in the case where it is intended to realize higher speed signal processing, the process of multiplication itself limits the speed of the signal processing, so that there occurs a limit in the signal band which can be processed to thereby make the field of utilization narrower in vain.

Particularly there is a case where the operation time of each multiplier becomes a problem when a digital signal processing system is constituted by combination of a plurality of multipliers. In the case of, for example, a digital filter in which multipliers are parallelly connected so that an output signal from each multiplier is used in the succeeding signal processing, it is required so that the signal inputting cycle and the signal processing timing accord with each other, and the digital signal processing cannot be executed if this timing is out of order. In such a digital signal processing system, therefore, it is necessary to make the operation time of each multiplier shorter than the cycle of the signal inputting.

However, high speed operation is difficult since the delay of a signal is produced bit by bit in respective Booth decoders if the Booth decoders are operated in parallel or in an overlapping manner in multipliers as in the conventional case. Particularly in the case of performing higher speed processing, production of a slight delay becomes a large obstacle on signal processing. Such a problem in high speed processing is more conspicuous in a transposition type shown in FIG. 13 than in a transversal type shown in FIG. 12. This is because the number of constituents is larger in the transposition type of FIG. 13, so that it is necessary to perform operation timing adjustment not only in each filter unit constituted by a storage element $4_k$, a delay element $2_k$, a multiplier $1_k$ and an adder $3_k$, but also between filter units. In view of the expansion of new fields of applications such as audio processing, video processing, and so on, and the development of multi-media, etc., it is strongly demanded to make the speed of the digital signal processing higher.

SUMMARY OF THE INVENTION

It is an object of the present invention to provide a method of processing a digital signal and an apparatus therefor, in which the signal processing speed is higher and there is no futility in system configuration.

The method of producing a digital signal according to the present invention relates to a signal processing process including a plurality of multiplication steps using the Booth's algorithm, the Booth's algorithm being executed in common to the respective multiplying steps so that the multiplying steps are executed on the basis of the result execution of the Booth's algorithm.

According to the method of the present invention, the Booth's algorithm which has been executed in an overlapping manner in the respective multiplication steps in the conventional case is executed in common without being overlapped in the respective multiplication steps. On the basis of the result of execution of the Booth's algorithm, succeeding operations are executed in the respective multiplication steps, so that the system has no futility, and high speed digital signal processing can be realized.

An apparatus for processing a digital signal according to the present invention has a plurality of multipliers, and blocks for executing the Booth's algorithm in the respective multipliers are separated as a Booth decoder which is used in common among the respective multipliers, that is, provided at one place. A representative example of this apparatus for processing a digital signal is a digital filter apparatus having a structure in which a plurality of multipliers are connected in parallel. The Booth decoder is a device for decoding input signals of $y_{2i}$, $y_{2i+1}$ and $y_{2i+2}$, in which a decoded signal B can take one of the values of 0, ±1, and ±2 in the case of using the secondary Booth's algorithm as mentioned above. However, the present invention is not intended to limit the Booth's algorithm to such a secondary one, and therefore the signal B is not always limited to these five values.

According to the apparatus of the present invention, the blocks for executing the Booth's algorithm for the respective multipliers are separated as a Booth decoder which is used in common among the respective multipliers, so that there is no futility in the configuration of the system, and not only the apparatus can be operated at a high speed, but also the digital signal processing circuit can be reduced in scale and hence in size. Further, since the Booth decoders can be made to be a single one, it is possible to suppress a bad effect caused by the delay of a signal in the Booth decoders as much as possible, and the timing in a digital signal processing system can be adjusted easily, so that it is possible to make the speed of operation higher.

Further, an apparatus for processing a digital signal according to the present invention has a transposition type digital filter. There is a conspicuous effect to shorten the time of operation particularly in the case of using a transposition type digital filter device.

Further, an apparatus for processing a digital signal according to the present invention has a multiplier not having a block for executing Booth algorithm and a plurality of operation units for practicing the same kinds or same operations as well as a Booth decoder for practicing commonly Booth algorithm and supplying decord signals to said multiplier.

The above and other objects as well as advantageous features of the invention will become more clear from the following description taken in conjunction with the drawings.

DETAILED DESCRIPTION OF THE PREFERRED EMBODIMENTS

Figure 1:
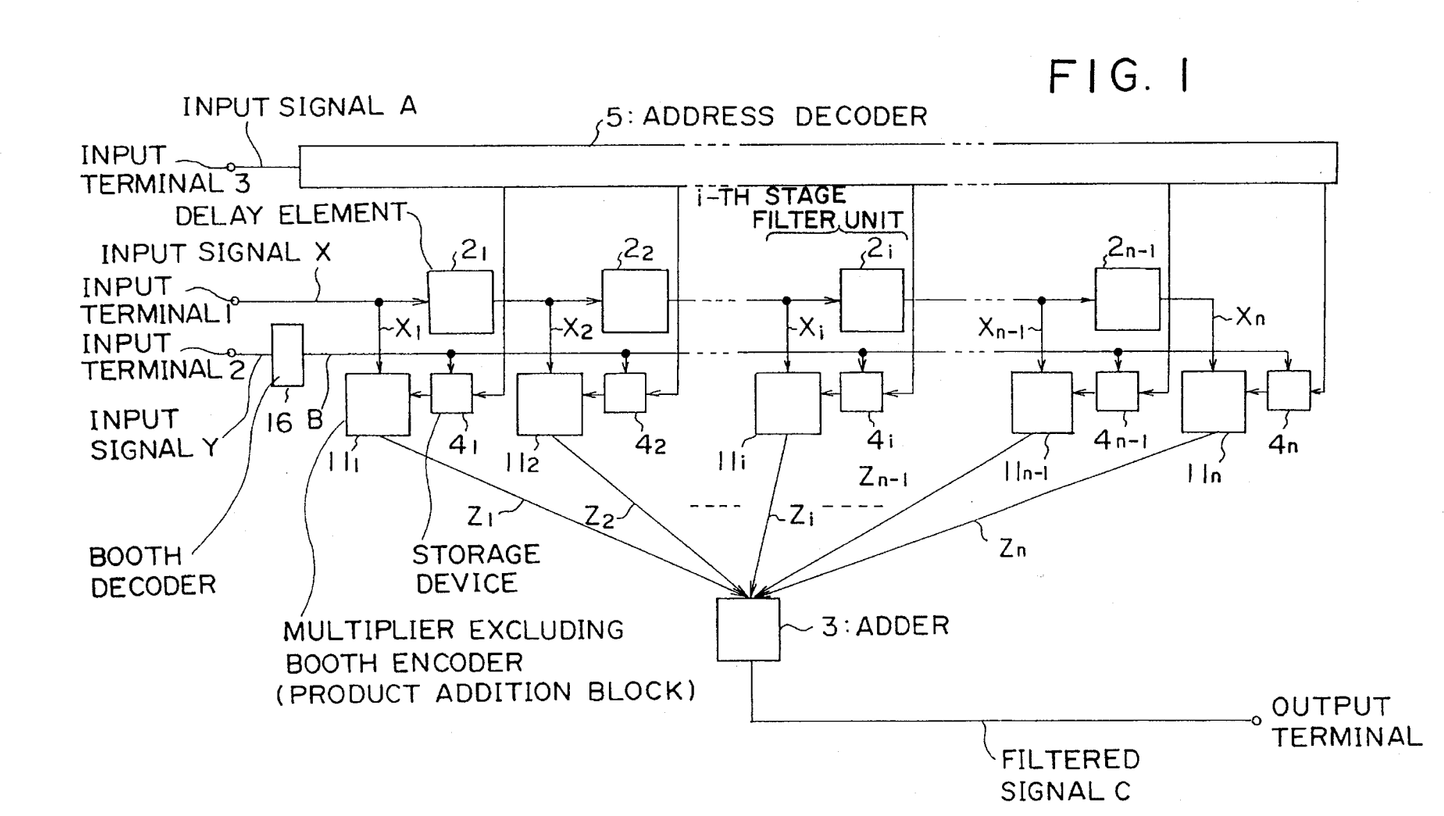
FIG. 1 is a diagram illustrating a basic circuit configuration of the direct type digital filter in accordance with an embodiment of the present invention.

FIG. 1 is a diagram illustrating a basic circuit configuration of the direct type digital filter in accordance with an embodiment of the present invention. In FIG. 1, the constituents. the same as those in FIGS. 3, 4 and 12 are referenced correspondingly. That is, the reference numeral 11 represents product addition blocks; 2, delay elements; 3, an adder; 4, storage elements such as registers; 5, an address decoder for performing the address assignment of storage elements in accordance with a signal C; and 16, a Booth decoder separated independently so as to be used in common. Each of the input signals X and Y has eight figures in the same manner as in the case of FIGS. 3 and 4. The signal X is supplied from a terminal 1 so as to pass through a plurality of delay elements 2. In the way of this process, a predetermined delay is given to the signal X. The input signal y which is a discrete variable is supplied from a terminal 2. The signal Y is decoded into $0, \pm 1$, or $\pm 2$ through the Booth decoder 16.

This Booth decoder 16 is separated from the product addition blocks 11 so as to be used in common to the multipliers 1 in FIGS. 3 and 4 (FIG. 12) or to the product addition blocks 11 in FIG. 1. A signal B (=(x, 2x, comp)) decoded by this decoder is accumulated in the registers 4 temporarily. The write timing of each register $4_k$ is controlled by the address decoder 5 in accordance with an input signal A. The output signal $X_k$ of each delay element $2_{k-1}$ (k=1, 2, ..., i, ..., n; 20 means no delay) and the decoded signal B are processed in each product addition block $11_k$ to thereby outputs a multiplication value $Z_k$. The multiplication values $Z_k$ are added totally in the adder 3. The adder 3 outputs a filtered signal C from an output terminal.

Figure 6:
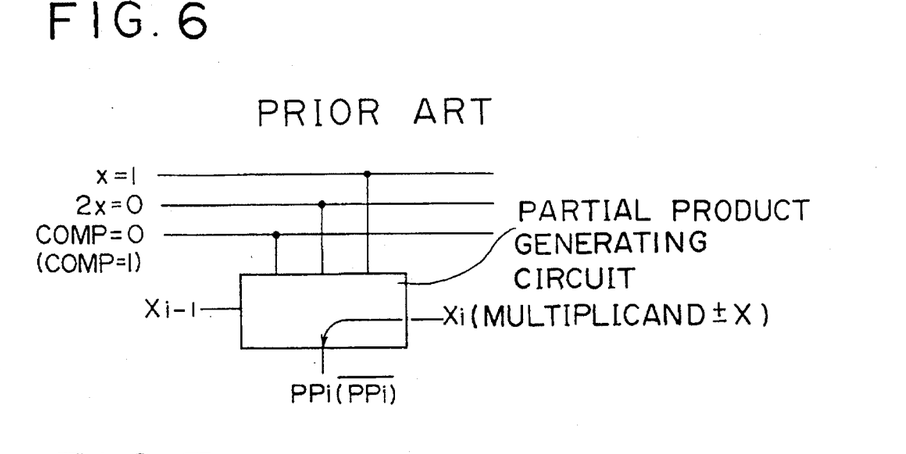
FIG. 6 is a diagram for explaining the operation of a partial product generating circuit.
Figure 7:
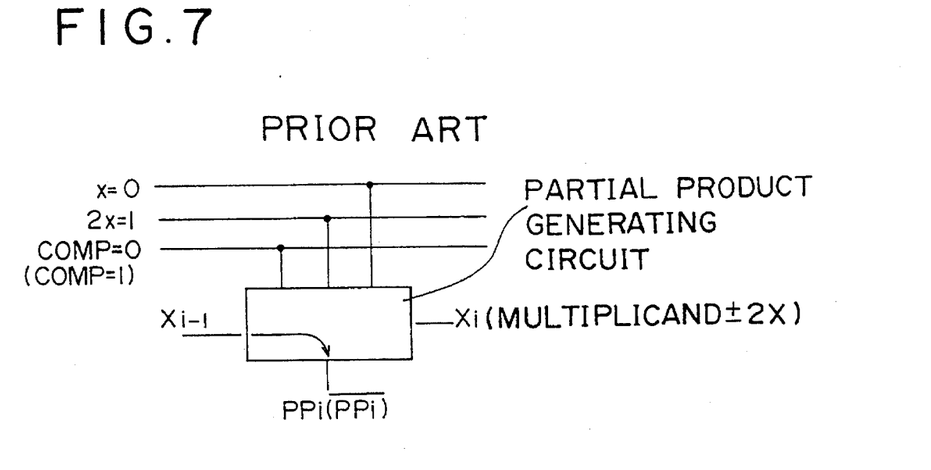
FIG. 7 is a diagram for explaining the operation of the partial product generating circuit.

Excepting the difference whether there is a Booth decoder block (6k) in each multiplier or not, the processing in each product addition block $11_k$ is the same as that in each multiplier $1_k$ in FIGS. 3 and 4 (FIG. 12) basically, and the corresponding portion of FIGS. 3 and 4 is referenced by the numeral $11_k$. Referring to FIGS. 6 to 8, the operation of the product addition block $11_k$ will be described. That is, a signal B from the Booth decoder 16 provided in common and a multiplicand X are processed in each group $7_h$ of partial product generating circuits $7_{hg}$ (h=1, 2, 3; g=1, 2, ..., 9) so that partial products are generated. These partial products are finally processed by a CLA 10 through a half adder 8 and whole adders $9_1$ and $9_2$. The CLA 10 generates and supplies the products $Z_k$ to the adder 3. If Booth decoders are united to be a single device so as to be separated from and so as to be used in common to a plurality of conventional multipliers as shown in this embodiment, it is not necessary to execute the Booth's algorithm in an overlapping manner, so that there is no futility in the system or in the processing method. Further, a decoded signal B is generated at a common place at one time before a series of signal processing, so that it is possible to reduce the time of signal processing between basic operation units constituted by a register $4_k$, a delay element $2_k$ and a product addition block $11_k$, and it is possible to make the speed of operation as a whole higher. Further, only one Booth decoder is needed while Booth decoders N in number are needed in the conventional case, so that it is possible to reduce the circuit scale by the Booth decoders (N−1) in number.

By the way, with respect to the digital filter indicated in FIG. 1, we call the unit consisting of the delay element $2_i$, the multiplier $1_i$ having the Booth decoder $6_i$ and the memory element $4_i$ "i-th stage filter unit" (i=1, 2, ... n) for convenience's sake. Then, it can be understood that the apparatus indicated in FIG. 1 is an apparatus in which n pieces of filter units are connected stepwise and the output signals $Z_j$ (j=1, 2, ... n) from respective steps are can be added by a single adder 3. Therefore, the above-mentioned embodiment can be understood that the Booth decoders heretofore overlappingly provided with a plurality of operation units dealing with same or same kinds of transactions can be employed separately as a common block for those operation units.

Figure 2:
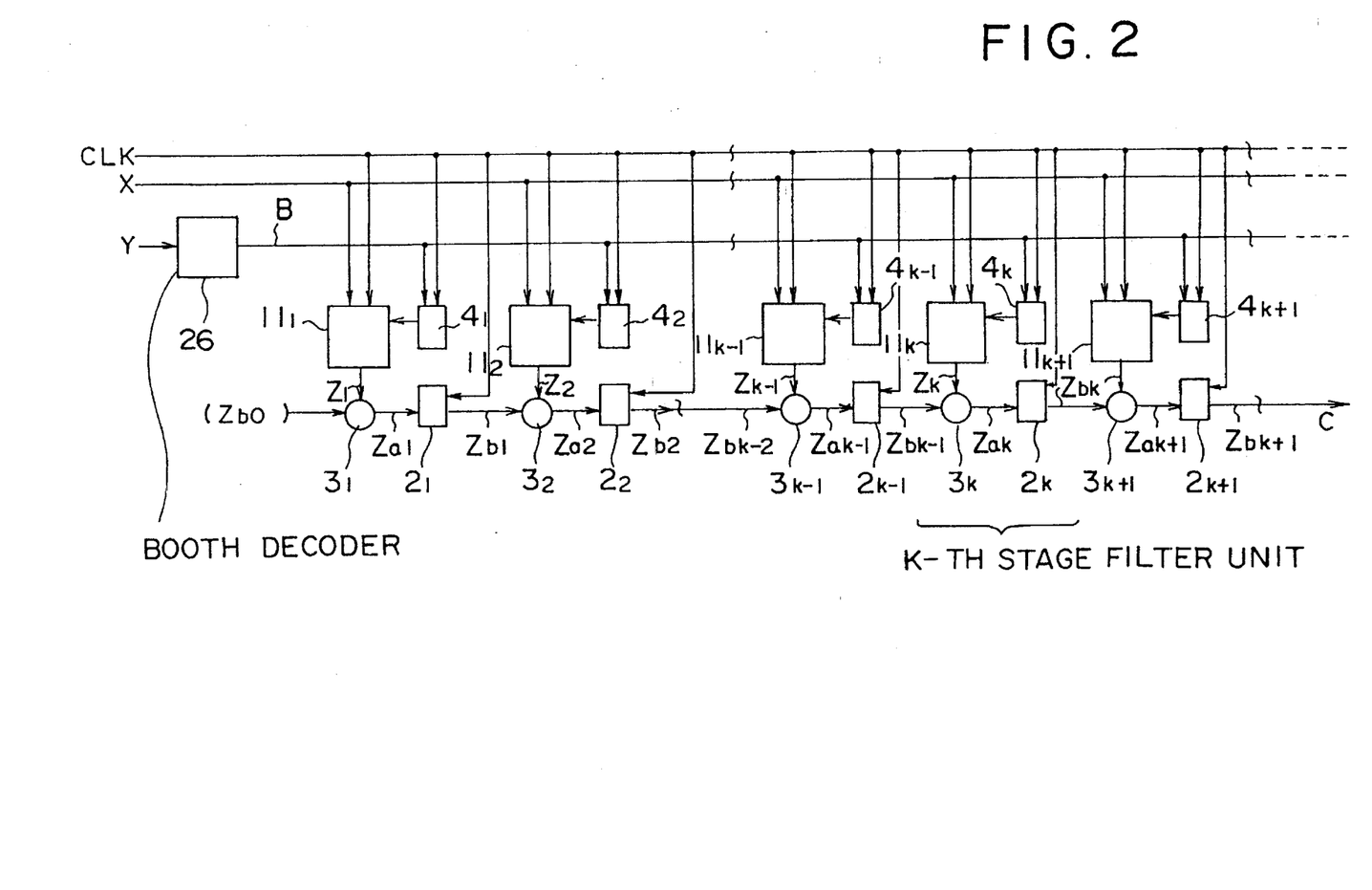
FIG. 2 is a diagram illustrating a basic circuit configuration of the transposition type digital filter in accordance with another embodiment of the present invention.

FIG. 2 is a diagram illustrating a basic circuit configuration of the transposition type digital filter according to another embodiment of the present invention. In FIG. 2, constituents the same as those in FIGS. 3, 4 and 13 are referenced correspondingly. That is, the reference numeral 11 represents product addition blocks; 2, delay elements; 3, an adder; 4, storage elements such as registers; and CLK represents a clock signal for controlling the operation of the storage elements 4 and the delay elements 2. The delay elements may be registers, but the words delay elements are used to avoid the complication with the storage elements 4. The reference numeral 26 represents a Booth decoder separated independently so as to be used in common. Each of input signals X and Y has eight figures in the same manner as in the case of FIGS. 3 and 4. A unit constituted by a storage element (register) $4_k$, a product addition block $11_k$, an adder $3_k$ and a delay element $2_k$ is called "a k-th stage filter unit".

The signal Y is decoded into a decoded signal B (=(x, 2x, comp)) in the Booth decoder 26. This Booth decoder 26 is used in common to the multipliers 1 in FIG. 13 or to the respective product addition blocks $11_k$ in FIGS. 3 and 4, the decoder being separated from each product addition block $11_k$ so as to be used in common. In the k-th filter unit, the signal B is once accumulated in the register $4_k$. The register $4_k$ is operated in response to the clock signal so that its write timing is controlled. In each product addition block $11_k$ supplied with the signal X, the signal B is further supplied from the storage element $4_k$. In response to the clock signal, the product addition block $11_k$ operates to process the signal X and the signal B, to execute the multiplication based on the Booth's algorithm totally, and to output a multiplication value $Z_k$. The operation of the product addition block $11_k$ is the same as the manner mentioned above with reference to FIGS. 6 to 8, and the description of the operation is therefore omitted.

The multiplication value $Z_k$ is added to a signal $Z_{bk-1}$ from the (k−1)-th stage in the adder $3_k$. The signal $Z_{ak}$ from the adder $3_k$ is supplied to the delay element $2_k$ so as to be subjected to delay so that the signal $Z_{ak}$ is made into a signal $Z_{bk}$. In the (k+1)-th stage filter unit, under the control by the clock signal CLK, the signal X and the signal B are processed in the same manner as in the k-th stage filter unit so that a signal $Z_{k+1}$ is outputted. The signal $Z_{k+1}$ and the signal $Z_{bk}$ are added to each other in the adder $3_{k+1}$ from which a signal $Z_{ak+1}$ is supplied to the delay element $2_{k+1}$. From the delay element $2_{k+1}$, a signal $Z_{bk+1}$ is generated to the (k+2)-th stage unit. After such an operation is repeated, a filtered signal C is finally outputted. In addition to a signal $Z_1$, a signal $Z_{b0}$ is supplied to an adder $3_1$, the signal $Z_{b0}$ being made to be a grounded signal in the above description.

In the conventional transposition type digital filter shown in FIG. 13, the sum of the operation time of a multiplier and the operation time of an adder in each filter unit and between filter units is adjusted so as to be not longer than the delay time. In this case, the Booths a logarithm is executed in an overlapping manner ]n the respective multipliers in vain. Further, since the Booth decoder in each of the multipliers has its own characteristic in view of its electric circuit, there occurs a slight difference in delay between the respective Booth decoder, so that there occurs a fault in performing strict control on operation timing. In the embodiment shown in FIG. 2, however, a single Booth decoder is provided separately so as to be used in common so that it is possible to eliminate the futility of the system to make it possible to rationalize the control on the operation timing. Accordingly, it is possible to improve the performance of signal processing, and it is possible to realize high speed operation.

By the way, the digital filter indicated in FIG. 2 can be understood to be an apparatus in which n pieces of filter units are connected stepwise and the output signals $Z_{bk}$ (k=1, 2, . . .) from the respective steps are added one by one. Therefore, the above-mentioned embodiment can be understood that the Booth decoders heretofore overlappingly provided with a plurality of operation units dealing with same or same kinds of transactions can be separately employed as a common block for those operation units.

Next, the effect in applying the present invention will be compared between the case of a transposition type digital filter and the case of a direct type digital filter.

Assume that an input signal Y is $N_Y$ [bit], and the degree of filter is n [tap] (provided n>1). Further, hereinafter, for the sake of convenience of the description, the case of the direct type digital filter and the case of the transposition type digital filter are distinguished from each other with characters "A" and "B" respectively.

In the direct-type and transposition-type digital filters in which the present invention is not applied, the maximum operation period Tm can be expressed as follows:

Direct type: $TmA = \alpha N_Y + \beta(n-1)$

Transposition type: $TmB = \kappa N_Y$ in which $\alpha$ and $\beta$ are proportional constants, and $\alpha > 0$ and $\beta > 0$.

In the direct-type and transportation-type digital filters in which the present invention is applied, the maximum operation period TM can be expressed as follows:

Direct type: $TMA = \kappa \alpha N_Y + \beta(n-1)$

Transportation type: $TMB = \kappa \alpha N_Y$ in which $\kappa$ is a proportional constant, and $0 < \kappa < 1$.

Therefore, the effect of applying the present invention, that is, the rate of shortening the operation time R (=(TM−TM)/TM can be expressed as follows:

$$\text{Direct type:} \quad RA = \frac{(1-\kappa)\alpha N_Y}{\alpha N_Y + \beta(n-1)} \quad (4)$$

Transposition type: $RB = 1 - \kappa$

Therefore, the rate of the effective degree between the above two kinds of digital filters can be expressed as follows:

$$\frac{RB}{RA} = \frac{\alpha N_Y + \beta(n-1)}{\alpha N_Y} > 1 \quad (5)$$

$$\therefore RB > RA$$

Therefore, the effect with which the present invention contributes to shortening the operation time is more conspicuous in the case of a transposition type digital filter than in the case of a direct type digital filter.

Although a case where a plurality of multipliers connected in parallel has been described as a typical example in the above embodiment, the present invention is not limited to such a case where a plurality of multipliers are connected in parallel, but it can be applied to any digital signal system so long as a plurality of multipliers are included therein. Further, the digital signal processing according to the present invention is not limited to that which relates to such a digital filter as described in the above embodiments, but even a digital filter in which an input signal is processed by the time division of each figure of the value thereof and a multi-order digital filter may fall with in the scope of the present invention so long as a plurality of multipliers are included therein. Further, in the case where there are provided a plurality of groups of multipliers and therefore there are provided a plurality of Booth decoders for the respective groups of multipliers in a digital signal processing apparatus, it is not to say that such a digital signal processing apparatus falls within the scope of the present invention because a plurality of multipliers are included in the apparatus.

By the way, in the present invention, the digital filter device as an example of plurality of arrangements is referred above mentioned. However, it is different for the operation unit to be able to execute the same or the same kind of operation and, in the operation process, it has the structural unit or module having the function containing multiplication. From the foregoing sense, the scope of present invention is not restricted to only the digital filter device but also to whole technique for processing digital signals.

By the way, in the present invention, though the block executing Booth algorithm has been called "Booth decoder", there is an instance where such a block is called "Booth encoder" (Japanese Laid-Open Publication No. 60-254372). Moreover, "the multiplier excluding Booth decoder" in the present invention does not mean a multiplier excluding only Booth decoder. That is to say, it means that the devices which exclude any blocks other than Booth decoder, too, and, as the result, Booth algorithm becomes common belong to the category which the present invention has intended.

What is claimed is:

1. In a method for processing a digital signal in a multiplying system having plural groups of multipliers, with each group of multipliers having multi-stages and with the processing executed based upon the Booth's algorithm wherein the improvement comprises the steps of:

inputting coefficients Y into a single Booth decoder arranged in common for a selected group of said multipliers in a sequence corresponding to each of its multi-stages for multiplying a multiplicand X, with said coefficients Y being consecutively processed to generate an output for each stage;

memorizing in a storage element said output of said common Booth decoder for each of said multi-stages;

inputting a multiplicand X into said selected group of multipliers for establishing a predetermined time delay output for each of said multi-stages;

multiplying the memorized output of said Booth decoder in each stage of said selected group by said time delayed output in the preceding state; and adding the products of the multiplication of the multi-stages of said selected group and outputting the product of the addition as a result of the signal processing for forming an accumulation multiplication for said selected group.

2. In a method for processing a digital signal based on the Booth's algorithm within a multiplying system having multiple stages of multipliers wherein the improvement comprises the steps of:

inputting coefficients Y into a single Booth decoder in sequence corresponding to each of said multiple stages for processing a multiplicand X, with said coefficients Y being consecutively processed to generate an output for each stage;

memorizing in a storage element the generated output of said Booth decoder corresponding to each of said multiple stages, inputting a multiplicand X into each stage and multiplying it by the output of said Booth decoder which has been memorized for each such stage;

adding the product of the multiplication in each of said multiple stages to the output of the preceding stage to establish a predetermined time delay for the product of the addition and supplying the time delayed product to the next consecutive stage so as to output a delayed product in the last stage as a result of the signal processing.

3. In a multiplying system having multi-stages of multipliers for processing a digital signal based on the Booth's algorithm, the improvement which comprises:

a single Booth decoder for processing a coefficient Y input corresponding to each of said multi-stages in which a multiplicand X is inputted to generate a multiplied output as a processed product;

a plurality of arithmetic processing units connected in series and a series of delay elements for forming a predetermined time delay for each of said multi-stages in consecutive sequence so as to provide a delayed output from said Booth decoder for each stage corresponding to the delayed output in the preceding stage; and an adder for adding the products of the multiplication, wherein each of said arithmetic processing units comprises a storage element for memorizing an output of said Booth decoder corresponding to each of the multi-stages, a delay element for providing a predetermined time delay to an output of the delay element of the preceding arithmetic processing unit, means for supplying the delayed product to the following delay element, and a multiplier which does not incorporate a Booth decoder for multiplying an output of the delay element of the preceding processing unit by the output of said Booth decoder memorized in the storage element of the present arithmetic unit.

4. In a multiplying system having multi-stages for processing a digital signal, based on the Booth's algorithm, the improvement comprising:

a single Booth decoder for processing a coefficient Y inputted corresponding to each of said multi-stages using a multiplicand X to generate an output to be multiplied and subsequently outputted as a processed product;

a plurality of arithmetic processing units connected in series, for multiplying a multiplicand X by an output from said single Booth decoder for each of said multi-stages, adding the product of the multiplication to the delayed output in the preceding stage, giving a predetermined time delay to the product of the addition, and subsequently supplying the delayed product to the next consecutive processing unit, wherein each of said arithmetic processing units comprises a storage element for memorizing an output of said Booth decoder corresponding to each of the multi-stages, a multiplier which includes no Booth decoder for multiplying an inputted multiplicand X by the output of said Booth decoder memorized in said storage element, an adder for adding the product of the multiplication of said multiplier to the delayed output of the preceding arithmetic processing unit, a delay element for giving a predetermined time delay to the output of said adder and means for supplying the delayed product to the arithmetic processing unit for the following stage.

* * * * *